(12) United States Patent
Hwang

(10) Patent No.: US 7,795,637 B2
(45) Date of Patent: Sep. 14, 2010

(54) ESD PROTECTION CIRCUIT

(75) Inventor: Jeong Sik Hwang, Seoul (KR)

(73) Assignee: MagnaChip Semiconductor, Ltd., Cheongju-si, Chungbuk (KR)

( * ) Notice: Subject to any disclaimer, the term of this patent is extended or adjusted under 35 U.S.C. 154(b) by 0 days.

(21) Appl. No.: 12/318,303

(22) Filed: Dec. 24, 2008

(65) Prior Publication Data

US 2009/0166671 A1    Jul. 2, 2009

(30) Foreign Application Priority Data

Dec. 28, 2007    (KR) .................. 10-2007-0139682

(51) Int. Cl.
*H01L 27/06* (2006.01)
*H01L 29/73* (2006.01)

(52) U.S. Cl. ............... 257/137; 257/173; 257/E27.015; 257/E29.181; 361/56

(58) Field of Classification Search ................ 257/137, 257/173, E27.015, E29.181; 361/56
See application file for complete search history.

(56) References Cited

U.S. PATENT DOCUMENTS

| 6,429,505 B1 | 8/2002 | Kunikiyo | 257/577 |
| 7,440,248 B2 | 10/2008 | Arai et al. | 361/56 |
| 2006/0050451 A1* | 3/2006 | Jen-Chou | 361/56 |

FOREIGN PATENT DOCUMENTS

| JP | 2006-261427 | 9/2006 |
| KR | 1998-068159 | 10/1998 |
| KR | 2002-0013370 | 2/2002 |
| KR | 10-2007-0018398 | 2/2007 |

* cited by examiner

*Primary Examiner*—Victor A Mandala
*Assistant Examiner*—Whitney Moore
(74) *Attorney, Agent, or Firm*—Morgan Lewis & Bockius LLP

(57) ABSTRACT

The present invention relates a technique using a silicon controlled rectifier (SCR) in a rail based non-breakdown (RBNB) ESD protection device that protects a micro chip from ESD stress.

To this end, an ESD protection circuit of the present invention comprises: a detection unit for detecting a rising time of a signal flowing into first and second power lines; a pre-driver for buffering and outputting an output signal of the detection unit; and a power clamp configured with an SCR operating according to the output signal of the pre-driver and connecting the first and second power lines with each other to control current flow between the first and second power lines; wherein the pre-driver includes: first and second MOS transistors respectively having a gate connected to an output terminal of the detection unit and a source connected to the second power line; and a first bipolar transistor respectively having a base connected to a drain of the second MOS transistor and an emitter connected to the first power line.

5 Claims, 4 Drawing Sheets

[Fig. 1]
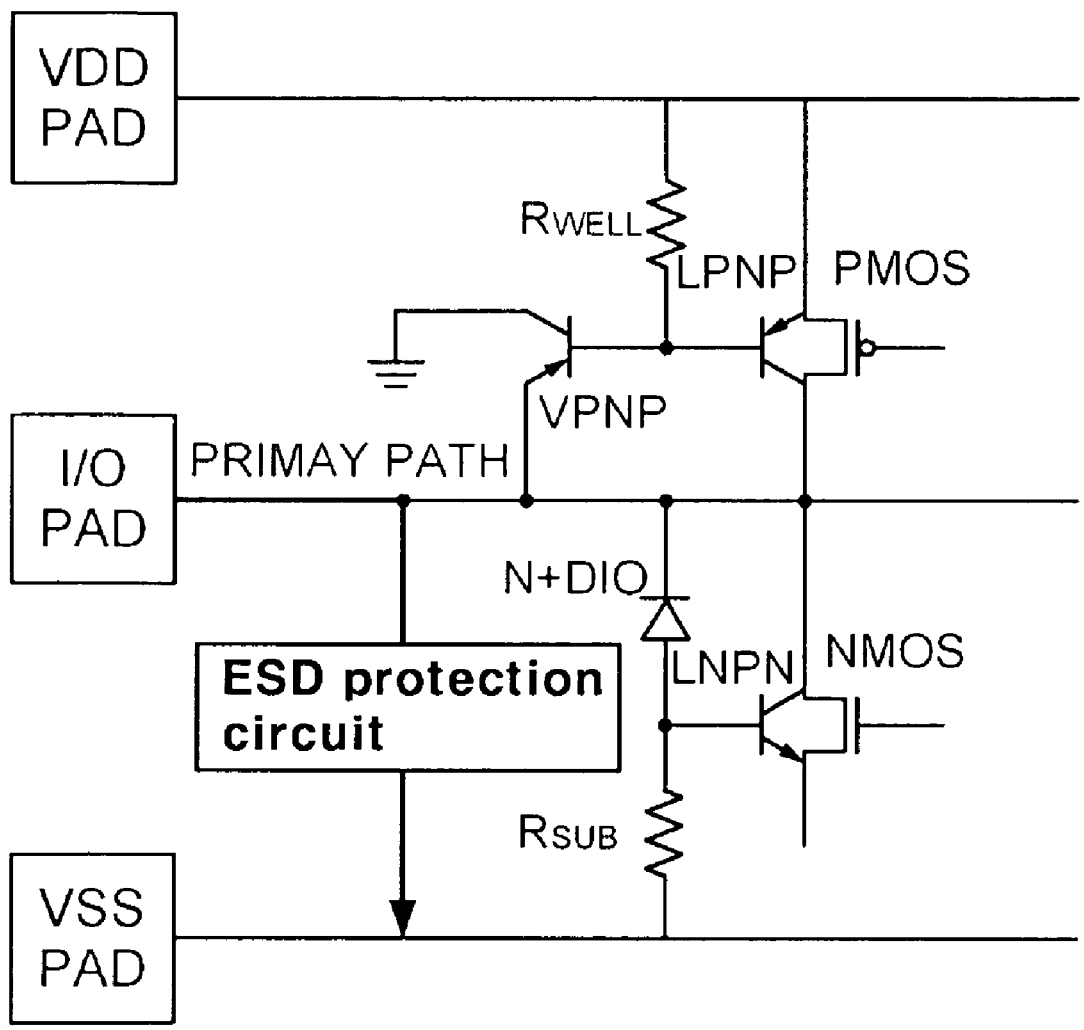

[Fig. 2]
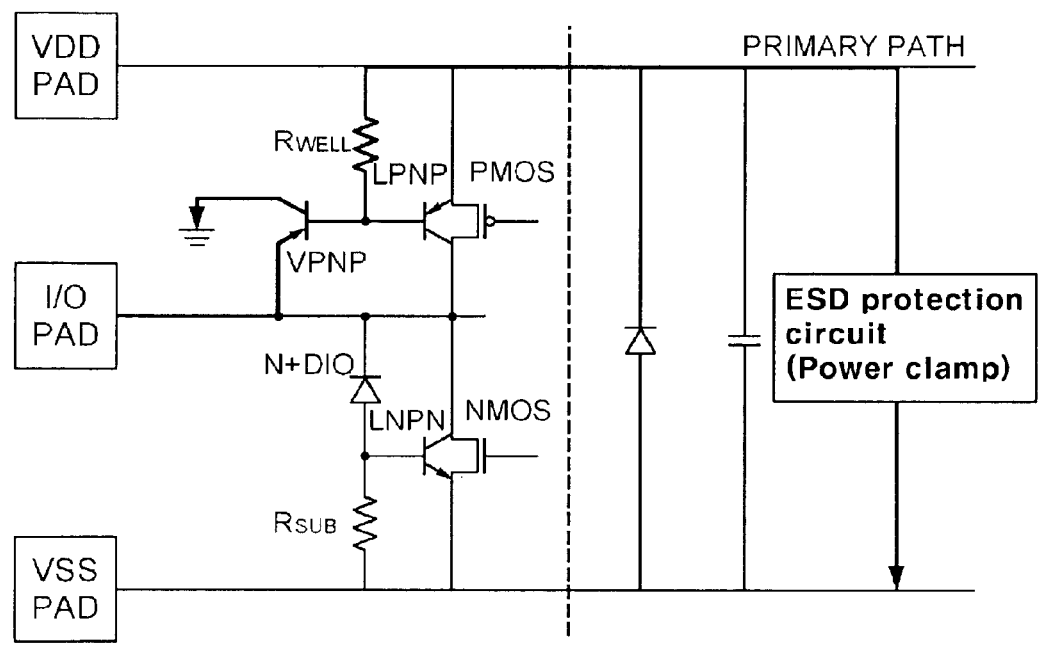

[Fig. 3]
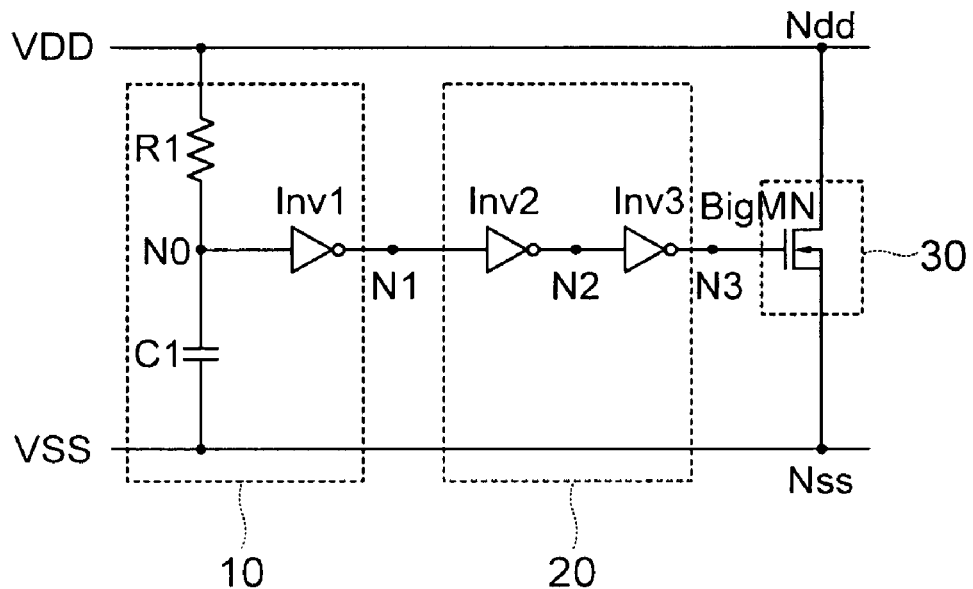
[Fig. 4]
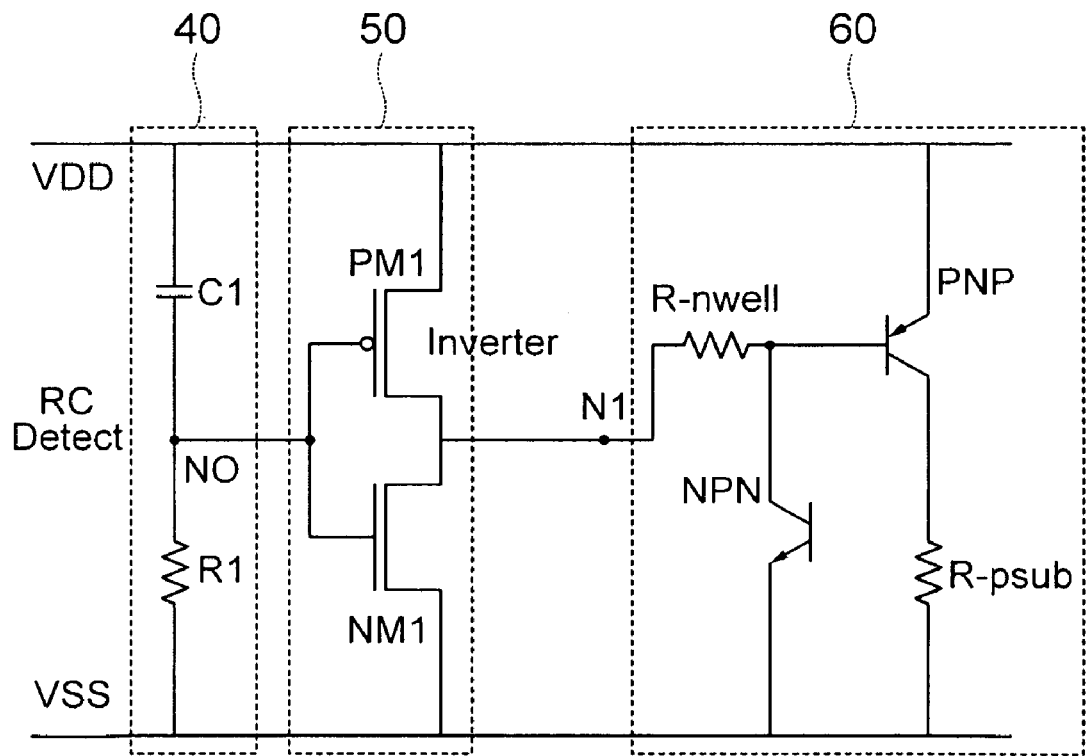

[Fig. 5]
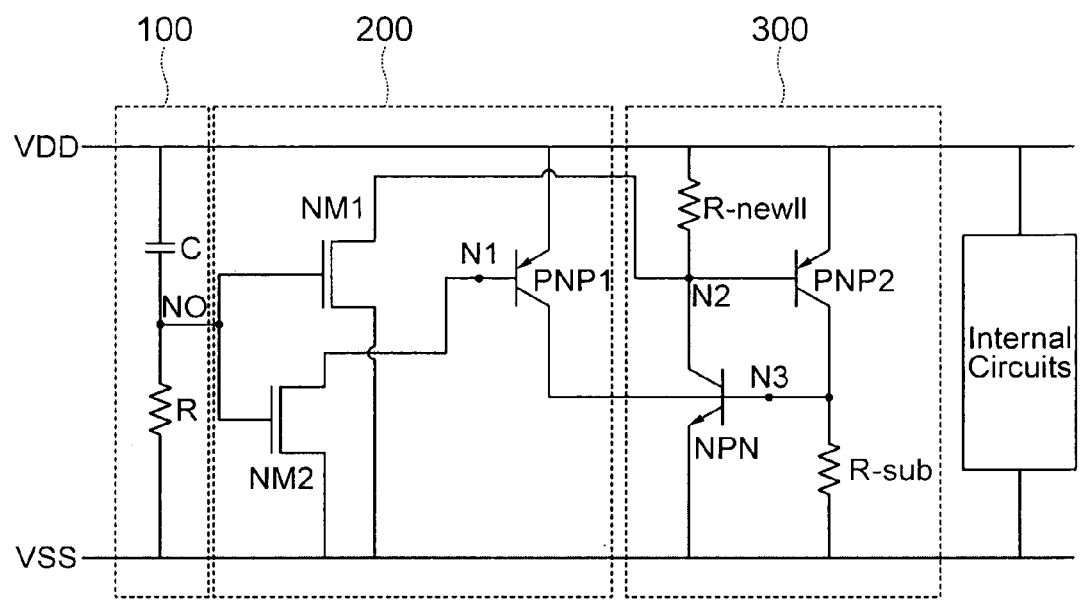

ESD PROTECTION CIRCUIT

BACKGROUND OF THE INVENTION

1. Field of the Invention

The present invention relates to an ESD protection device, and more particularly, to a technique using a silicon controlled rectifier (SCR) in a rail based non-breakdown (RBNB) ESD protection device that protects a micro chip from ESD stress.

2. Background of the Related Art

Semiconductor integrated circuits are very sensitively affected by high voltage flowing into from electrostatic discharge (or static electricity) generated outside. If the high voltage abruptly flows into a chip due to such electrostatic discharge (ESD), the flowing in high voltage destroys thin insulators, channels, and the like formed in the integrated circuit and destroys the chip itself.

An ESD protection apparatus previously discharges high voltage or high current momentarily flowing into the integrated circuit so that the high voltage or current cannot flow into other circuits in the chip.

A semiconductor (or silicon) controlled rectifier (SCR) using a PN junction is widely used as the ESD protection apparatus.

Since the SCR discharges a large amount of current per unit area, the SCR is spotlighted as an ESD protection apparatus in early stage integrated circuits. However, as the integrated circuits are integrated in further higher density and the size of a chip is reduced, due to high turn-on voltage (trigger voltage or threshold voltage) of the SCR and low holding voltage that maintains the turn-on state of the SCR, the SCR is difficult to be applied to recent integrated circuits.

On the other hand, a method of protecting internal core circuits (or input and output buffers) from ESD stress in each input/output (I/O) pad can be classified into a direct pad based ESD (DPBESD) protection circuit and a PowerRail based ESD (PRBESD) protection circuit.

FIG. 1 is a circuit diagram showing a general DPBESD protection circuit, in which an ESD protection circuit in each input/output pad copes with ESD stress flowing into the I/O pad.

Although the DPBESD protection circuit does not need to consider parasitic bus resistance between each I/O pad and power clamp at all and can implement the best ESD protection performance if the ability of handling stress current of an ESD protection circuit applied to each I/O pad is favorable, it is difficult to expect an stable and efficient ESD protection performance if a favorable ESD protection circuit cannot be implemented for a given technology.

In addition, since a separate ESD protection circuit should be installed in each I/O pad, there is a problem in that efficiency of layout area is lowered, and in the worst case, it is impossible to secure a layout area for installing a separate ESD protection circuit in each I/O pad.

FIG. 2 is a circuit diagram showing operational characteristics of a general PRBESD protection circuit, which is a method of handling ESD stress by installing only a bypass diode path in each I/O pad and using a power clamp installed between power rings that are between power voltage Vdd and ground voltage Vss.

Since the PRBESD protection circuit does not have an ESD protection circuit one-to-one corresponding to each I/O pad, it is relatively further difficult to implement a stable ESD protection characteristic compared with a DPBESD protection circuit. However, it is advantageous in that since a separate ESD protection circuit does not need to be installed for each I/O pad, efficiency of a layout area is high.

In addition, in handling the ESD stress, it is possible to be assisted with current of a vertical PNP BJT of a CMOS device and N-well of the entire chip.

Contrarily, when parasitic bus resistance (including resistance of forward operation diode path) between each I/O pad and the power clamp is too high, a problem may occur since stress current flows into the core circuit (or output and input buffers) before the ESD protection power clamp operates.

A non-breakdown type (NB type) power clamp is employed in the PRBESD protection circuit as a device for particularly processing ESD stress current, which is named as a rail based non-breakdown (RBNB) ESD protection circuit.

Such an RBNB ESD protection circuit generally employs a method of configuring an active clamp using normal operation of a big MOS transistor.

Accordingly, a triggering circuit is needed for the power clamp MOS transistor, and it is advantageous in that the risk of damaging the core circuit (or input and out buffers) is low since triggering voltage of the power clamp MOS transistor is low in a situation of ESD stress.

FIG. 3 is a view showing the configuration and operation principle of a so-called "1RC3Inv_Std" ESD protection circuit, which is a kind of generally used RBNB (Rail Based Non-Breakdown) ESD protection scheme.

As shown in FIG. 3, the "1RC3Inv_Std" ESD protection circuit includes a rising time detector 10 for detecting a rising time of voltage applied between Vdd-Vss lines, a pre-driver 20 for driving and outputting output of the rising time detector 10, and a power clamp 30 operating according to a signal driven by the pre-driver 20 and controlling flow of current between the Vdd-Vss lines.

The rising time detector 10 comprises one RC-filter where a resistor R1 and a capacitor C1 are connected between the Vdd-Vss lines in a series and an inverter INV1 for inverting and outputting electric potential of node N0 between the resistor R1 and the capacitor C1.

The pre-driver 20 comprises two inverters Inv2 and Inv3 connected in a series in the form of a chain in order to buffer and output the output of the rising time detector 10.

The power clamp 30 comprises a big MOS transistor (BigMN) that operates using output voltage outputted from the pre-driver 20 as gate input.

Since such an RBNB ESD protection circuit uses saturation current (drain current) (Idsat current) of a normal MOS transistor, it is disadvantageous in that efficiency of a layout area is low since a large active width is needed.

As a technique for improving the disadvantage of low layout area efficiency of the RBNB ESD protection circuit using a big MOS transistor (BigNM) of the prior art, it is proposed a technique using an SCR having a superior current driving characteristic in comparison with an area, instead of the big MOS transistor (BigNM), as shown in FIG. 4.

Referring to FIG. 4, it is a configuration circuit diagram of a so-called "1RC1Inv_SCR" ESD protection circuit, which is one of RBNB ESD protection schemes, comprising a rising time detector 40, a pre-driver 50, and a power clamp 30.

Here, the power clamp 60 includes an SCR operating according to a signal driven by the pre-driver 50 and controlling flow of current between the Vdd-Vss lines.

The rising time detector 40 includes one RC-filter where a resistor R1 and a capacitor C1 are connected between the Vdd-Vss lines in a series.

The pre-driver 20 includes an inverter INV1 having an NMOS transistor NM and a PMOS transistor PM for inverting and outputting electric potential of node N0 of the rising time detector 40, which applies a bias to the N-well of the SCR power clamp 60 and turns on and off the SCR when the circuit is in a normal operation or applied with ESD stress.

According to such a configuration, when difference of voltage between Vdd-Vss changes in a function of time, since voltage of N0 follows the difference of voltage between Vdd-Vss with an RC delay due to the RC-filter, the "1RC1Inv_SCR" ESD protection circuit operates as described below in situations of ESD stress, normal power ramp up, and normal power on.

First, in the ESD stress situation, if ESD stress having a normal rising time (<<R1C1) and interval (≦R1C1) is applied between the Vdd-Vss lines while power is not applied between the Vdd-Vss lines, i.e., when Vdd=0 and Vss=0, N0 is in a low state, PM1 is in an on state, N1 is in a high state, and SCR is in an on state during the rising time and interval of the ESD stress.

That is, the SCR is triggered by the inverter Inv1 to operate and thus copes with the ESD stress current.

In the case of the normal power ramp-up situation, if power ramped up at a speed lower than a time constant R1C1 of the RC filter is applied to Vdd-Vss while power is not applied between the Vdd-Vss lines, i.e., when Vdd=0 and Vss=0, the state of N0 is low, PM1 is on, and N1 is high is maintained in the initial stage of the ramp-up. Therefore, a bias is applied to the N-well of the SCR, and the SCR is in a situation difficult to be turned on and thus maintains the off state.

In the case of the normal power on situation, when normal power is applied between the Vdd-Vss lines, i.e., when Vdd=3.3V and Vss=0V, basically, the state of N0 is low, PM1 is on, N1 is high, and the SCR is off is maintained, and thus current does not flow through the SCR.

As a result, in the "1RC1Inv_SCR" ESD protection circuit, the ESD stress current is coped with since the SCR operates in the ESD stress situation, and leakage current is not induced between the Vdd-Vss power lines since the SCR doe not operate in the normal operation situation.

However, since an inverter having low current drive capability of low degree of integration is used in this technique in order to trigger the SCR, it is disadvantageous in that efficiency of the layout area is low.

SUMMARY OF THE INVENTION

Therefore, the present invention has been made in view of the above problems, and it is an object of the present invention to provide an ESD protection circuit, in which an SCR having a superior current driving characteristic in comparison with area is applied, instead of a big MOS transistor (BigMN), to an RBNB ESD protection circuit, and a BJT device having a superior current driving capability is used to trigger the SCR, and thus efficiency of layout area is improved so that a micro chip may properly operate in an ESD stress current state and a normal operation state.

To accomplish the above object, according to one aspect of the present invention, there is provided an a detection unit for detecting a rising time of a signal flowing into first and second power lines; a pre-driver for buffering and outputting an output signal of the detection unit; and a power clamp configured with an SCR operating according to the output signal of the pre-driver and connecting the first and second power lines with each other to control current flow between the first and second power lines; wherein the pre-driver includes: first and second MOS transistors respectively having a gate connected to an output terminal of the detection unit and a source connected to the second power line; and a first bipolar transistor respectively having a base connected to a drain of the second MOS transistor and an emitter connected to the first power line.

Here, the first and second MOS transistors may be configured with an NMOS transistor.

In addition, the power clamp may include: a second bipolar transistor connected between an output of the first bipolar transistor and the first and second power lines Vdd and Vss; and a third bipolar transistor connected between an output of the first MOS transistor and the first and second power lines Vdd and Vss.

In addition, the first and second bipolar transistors are respectively a PNP bipolar transistor, and the third bipolar transistor is configured with an NPN bipolar transistor.

Then, the detection unit can be configured with an RC filter connected between the first and second power lines in a series.

The present invention is advantageous in that it is possible to implement an ESD protection circuit using a bipolar transistor having a high current driving capability compared with an inverter, which allows a micro chip to properly operate in an ESD stress current situation and a normal operation situation Furthermore, since a bipolar transistor having high integration efficiency compared with an inverter, it is advantageous in that efficiency of layout area can be enhanced.

BRIEF DESCRIPTION OF THE DRAWINGS

FIG. 1 is a circuit diagram showing a general DPBESD protection circuit.

FIG. 2 is a circuit diagram showing operational characteristics of a general PRBESD protection circuit.

FIG. 3 is a circuit diagram showing a generally used RBNB (Rail Based Non-Breakdown) ESD protection circuit.

FIG. 4 is a circuit diagram showing an RBNB (Rail Based Non-Breakdown) ESD protection circuit that improves disadvantages of the ESD protection circuit shown in FIG. 3.

FIG. 5 is a circuit diagram showing an ESD protection circuit according to an embodiment of the present invention.

DETAILED DESCRIPTION OF THE PREFERRED EMBODIMENT

FIG. 5 is a circuit diagram showing an ESD protection circuit according to an embodiment of the present invention.

Referring to FIG. 5, the ESD protection circuit comprises a detection unit 100, a pre-driver 200, and an SCR 300.

The detection unit 100 detects a rising time of a signal flowing into first and second power lines Vdd and Vss, which comprises an RC filter connected to the first and second power lines Vdd and Vss in a series as shown in the figure.

The pre-driver 200 buffers and outputs an output signal of the node N0 of the detection unit 200, which comprises a first MOS transistor NM1, a second MOS transistor NM2, and a first bipolar transistor PNP1.

Here, gates of the first and second MOS transistors NM1 and NM2 are respectively connected to the output terminal N0 of the detection unit, and sources of the first and second MOS transistors are respectively connected to the second power line Vss. The first and second MOS transistors NM1 and NM2 are preferably configured of an NMOS transistor and reduce risk of latch-up.

In addition, the base of the first bipolar transistor PNP1 is connected to the drain of the second MOD transistor NM2, and the emitter is connected to the first power line Vdd.

In the present invention described above, a bipolar transistor having a relatively small size and superior current driving capability compared with an inverter is used as the pre-driver 200 for triggering an SCR 300 in order to improve disadvantages of a method of configuring only with inverters in the prior art. Therefore, since the SCR 300 can be easily turned on by a pre-driver of a further smaller size, the size of an entire ESD device can be reduce by 40% or more.

On the other hand, the SCR 300 is a rectifying device operating based on an output signal of the pre-driver 200 and connecting the first and second power lines Vdd and Vss with each other in order to control current flow between the first and second power lines Vdd and Vss.

At this point, the SCR 300 includes a second bipolar transistor NPN, a third bipolar transistor NPN2, and voltage dropping devices R-nwell and R-sub.

The base of the second bipolar transistor NPN is connected to the collector of the first bipolar transistor PNP1, and the collector is connected to the connection node N2 connecting the first power line Vdd and the drain of the first MOS transistor NM1. The emitter of the second bipolar transistor NPN is connected to the second power line Vss. In addition, a voltage dropping device R-sub is connected between the second bipolar transistor NPN and the second power line Vss.

Then, the base of the third bipolar transistor PNP2 is connected to the connection node N2 connecting the drain of the first MOS transistor NM1 and the first power line Vdd, and the emitter is connected to the first power line Vss. The collector of the third bipolar transistor PNP2 is connected to the connection node N3 connecting the second power line Vss and the collector of the first bipolar transistor NPN1. In addition, a voltage dropping device R-nwell is connected between the third bipolar transistor PNP2 and the first power line Vdd.

Operation of the ESD protection circuit according to an embodiment of the present invention is described below.

First, in an ESD stress situation, if ESD stress having a normal rising time (<<RC) and interval (≦RC) is applied between the Vdd-Vss lines while power is not applied between the Vdd-Vss, i.e., when Vdd=0 and Vss=0, N0 is in a high state, N1 is in a low state, N2 is in a low state, and N3 is in a high state during the rising time and interval of the ESD stress, and thus the SCR 300 turns to an on state.

That is, the SCR 300 is triggered by the first MOS transistor NM1 and the second bipolar transistor PNP2 of the pre-driver 200 and turned on to operate at a low threshold voltage Vt1, thereby sensitively coping with the ESD stress.

For example, the node N0 between R and C of the RC filter is turned to high by a pulse having a fast rising time of about 10 ms, and thus the first and second MOS transistors NM1 and NM2 are turned on.

The third bipolar transistor PNP2 is triggered to discharge base current to Vss by turning on of the first MOS transistor NM1, which assists turning on of the third bipolar transistor PNP2.

Then, base current of the first bipolar transistor PNP1 is discharged to Vss by turning on of the second MOS transistor NM2, and amplified current flows to the collector again. The collector current acts as base current of the second bipolar transistor NPN and assists turning on of the second bipolar transistor NPN.

The SCR 300 is triggered passing through such a series of processes, and the SCR 300 is turned on at a low threshold voltage. Therefore, the SCR 300 charges electrostatic protection current with Vss further faster, and thus ESD stress current is properly coped with.

On the other hand, in the case of a normal power ramp-up situation, if power ramped up at a speed lower than a time constant RC of the RC filter is applied to Vdd-Vss while power is not applied between the Vdd-Vss lines, i.e., when Vdd=0 and Vss=0, the state of N0 is low, NM2 is off, and the first bipolar transistor PNP1 is off is maintained in the initial stage of the ramp-up. Therefore, a bias is applied to the N-well of the SCR 300, and the SCR 300 is in a situation difficult to be turned on and thus maintains the off state.

For example, if Vdd is applied at a ramp-up time slower than 10 ns of the rising time of an ESD pulse, N0 is turned to a low state by the RC-filter operation, and the first and second MOS transistors NM1 and NM2 maintain the off state.

Since the first bipolar transistor PNP1 also maintains the off state according thereto, a source for triggering the SCR does not exist, and thus the SCR turns to the off state where current does not flow.

In addition, in the case of a normal power on situation, when normal power is applied between the Vdd-Vss lines, i.e., when Vdd=3.3V and Vss=0V, basically, the state of node N0 is low, the first MOS transistor NM1 is off, and the first bipolar transistor PNP1 is off is maintained, and thus current does not flow through the SCR.

As a result, although a trigger control similar to that of a 1RC1Inv_SCR ESD protection circuit is accomplished as an operational principle, since a pre-driver for triggering the SCR uses a bipolar transistor having a small size and a superior current driving capability compared with an inverter used in the prior art, the SCR can be easily turned on by a pre-driver of a small size, and the size of the entire ESD device can be reduced more than 40%.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An ESD protection circuit comprising:
    a detection unit for detecting a rising time of a signal flowing into first and second power lines;
    a pre-driver for buffering and outputting an output signal of the detection unit; and
    an SCR operating according to the output signal of the pre-driver and connecting the first and second power lines with each other to control current flow between the first and second power lines;
    wherein the pre-driver includes:
    first and second MOS transistors respectively having a gate connected to an output terminal of the detection unit and a source connected to the second power line;
    and a first bipolar transistor respectively having a base directly connected to a drain of the second MOS transistor and an emitter connected to the first power line.

2. The circuit according to claim 1, wherein the first and second MOS transistors are an NMOS transistor.

3. The circuit according to claim 1, wherein the SCR includes:
    a second bipolar transistor connected between an output of the first bipolar transistor and the first and second power lines Vdd and Vss; and
    a third bipolar transistor connected between an output of the first MOS transistor and the first and second power lines Vdd and Vss.

4. The circuit according to claim 3, wherein the first and second bipolar transistors are respectively a PNP bipolar transistor, and the third bipolar transistor is an NPN bipolar transistor.

5. The circuit according to claim 1, wherein the detection unit is configured with an RC filter connected between the first and second power lines in series.

* * * * *